(12) United States Patent
Kim et al.

(10) Patent No.: US 11,417,597 B2
(45) Date of Patent: Aug. 16, 2022

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Bong-Soo Kim, Sejong-si (KR); Juhyeon Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/105,736

(22) Filed: Nov. 27, 2020

(65) Prior Publication Data

US 2021/0351122 A1    Nov. 11, 2021

(30) Foreign Application Priority Data

May 7, 2020   (KR) .................. 10-2020-0054413

(51) Int. Cl.
*H01L 23/522*   (2006.01)
*H01L 23/528*   (2006.01)
*H01L 23/31*    (2006.01)

(52) U.S. Cl.
CPC ...... *H01L 23/5226* (2013.01); *H01L 23/3114* (2013.01); *H01L 23/3121* (2013.01); *H01L 23/5283* (2013.01)

(58) Field of Classification Search
CPC . H01L 25/50; H01L 25/0657; H01L 23/3128; H01L 23/5226; H01L 23/3114; H01L 24/16; H01L 21/568
See application file for complete search history.

(56) References Cited

U.S. PATENT DOCUMENTS

| | | | |
|---|---|---|---|
| 7,545,047 B2 * | 6/2009 | Bauer | H01L 24/19 257/774 |
| 8,736,033 B1 * | 5/2014 | Chuo | H05K 1/185 257/659 |
| 9,220,168 B2 | 12/2015 | Zanma et al. | |

(Continued)

FOREIGN PATENT DOCUMENTS

| | | |
|---|---|---|
| KR | 1020140050799 A | 4/2014 |
| KR | 1020170122345 A | 11/2017 |

(Continued)

*Primary Examiner* — Jaehwan Oh
*Assistant Examiner* — John M Parker
(74) *Attorney, Agent, or Firm* — Sughrue Mion, PLLC

(57) ABSTRACT

Provided is a semiconductor package including a redistribution substrate, a connection substrate on the redistribution substrate, the connection substrate having an opening that penetrates the connection substrate, a semiconductor chip in the opening of the connection substrate, and a molding layer that covers the semiconductor chip and the connection substrate, and fills a space between the semiconductor chip and the connection substrate, the connection substrate includes a base layer, a plurality of vias that vertically penetrate the base layer, a plurality of first patterns on a top surface of the base layer and connected to the plurality of vias, and a plurality of second patterns on a bottom surface of the base layer and connected to the plurality of vias, an extension of the molding layer extends into a plurality of holes that are spaced apart from the plurality of vias and are formed to vertically penetrate the base layer.

19 Claims, 14 Drawing Sheets

(56) References Cited

U.S. PATENT DOCUMENTS

| | | | |
|---|---|---|---|
| 9,502,391 B2 | 11/2016 | Kwon et al. | |
| 9,972,601 B2 * | 5/2018 | Meyer | H01L 21/568 |
| 10,276,467 B2 | 4/2019 | Kim et al. | |
| 10,461,008 B2 | 10/2019 | Jeong et al. | |
| 2011/0164391 A1 * | 7/2011 | Shin | H05K 3/445 |
| | | | 361/761 |
| 2015/0187742 A1 * | 7/2015 | Kwon | H01L 21/568 |
| | | | 257/774 |
| 2017/0178992 A1 * | 6/2017 | Jeong | H01L 24/10 |
| 2017/0309523 A1 | 10/2017 | Sohn et al. | |
| 2017/0358467 A1 | 12/2017 | Chang et al. | |
| 2019/0035758 A1 * | 1/2019 | Hwang | H01L 24/24 |
| 2019/0229055 A1 | 7/2019 | So et al. | |
| 2019/0341356 A1 | 11/2019 | Chung et al. | |
| 2021/0098421 A1 * | 4/2021 | Wu | H01L 25/0652 |
| 2021/0305223 A1 * | 9/2021 | Shih | H01L 25/105 |

FOREIGN PATENT DOCUMENTS

| | | |
|---|---|---|
| KR | 1020170140851 A | 12/2017 |
| KR | 102015910 B1 | 10/2019 |

\* cited by examiner

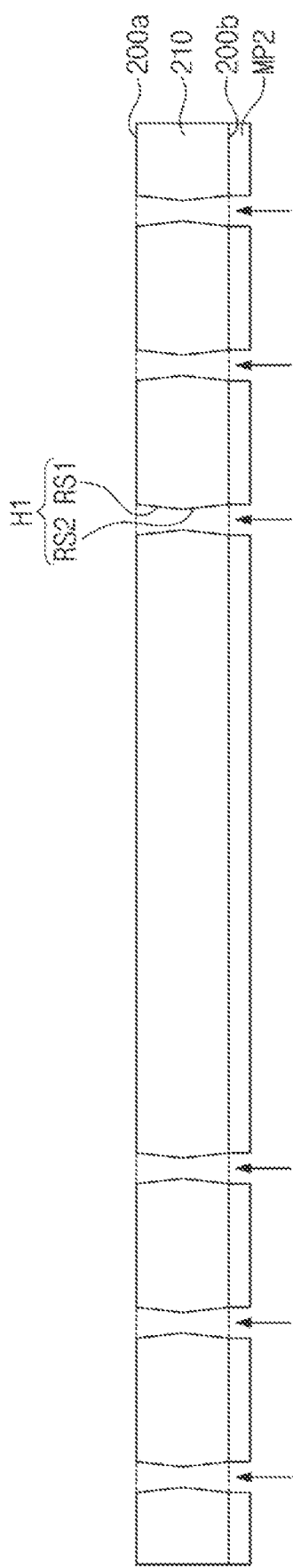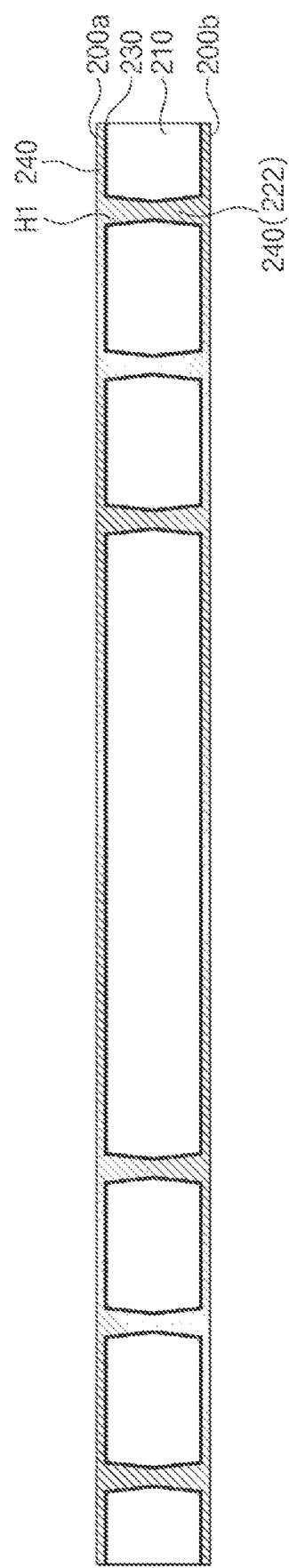

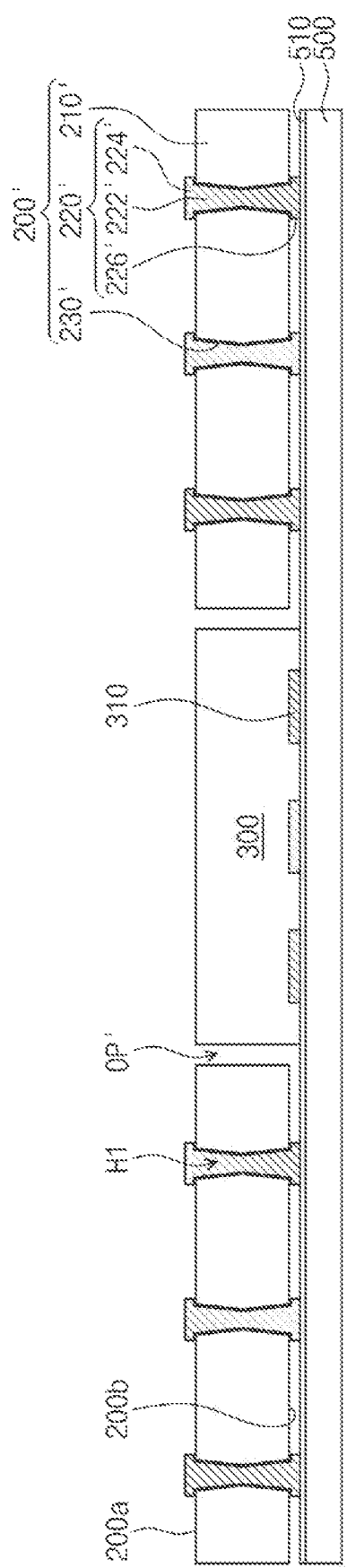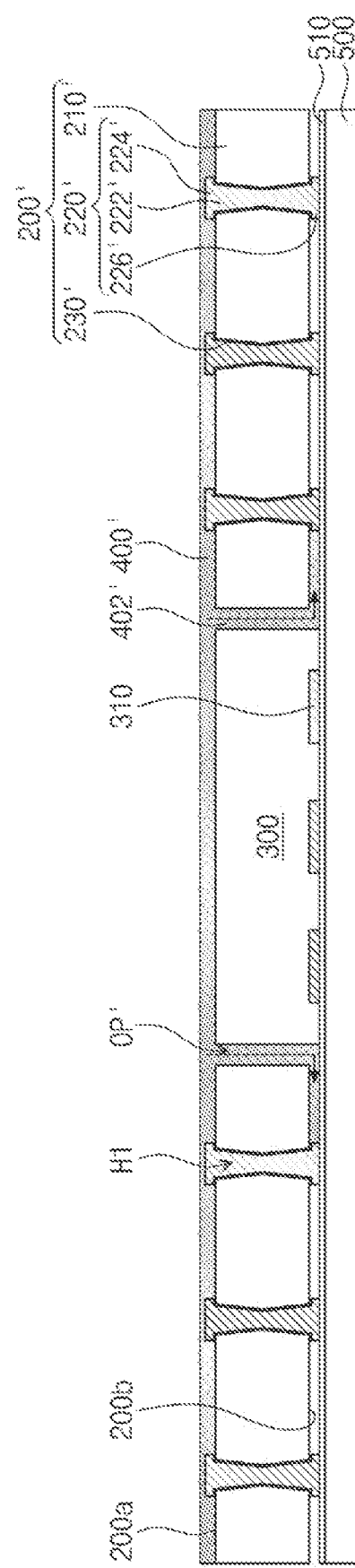

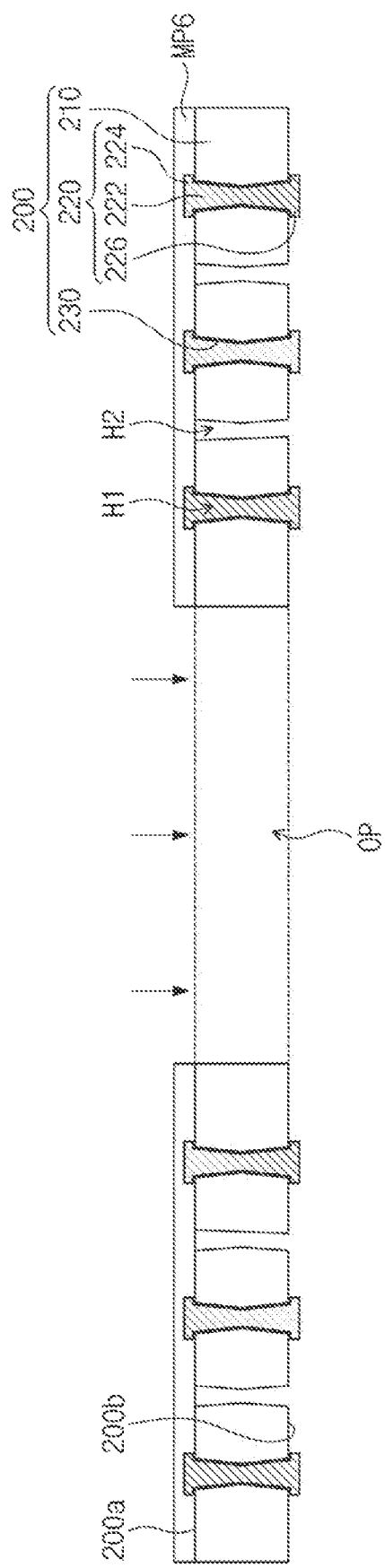

SEMICONDUCTOR PACKAGE AND METHOD OF FABRICATING THE SAME

CROSS-REFERENCE TO THE RELATED APPLICATION

This application claims priority under 35 U.S.C. § 119 to Korean Patent Application No. 10-2020-0054413, filed on May 7, 2020 in the Korean Intellectual Property Office, the disclosure of which is hereby incorporated by reference in its entirety.

BACKGROUND

Example embodiments of the present disclosure relate to a semiconductor package and a method of fabricating the same, and more particularly, to a panel-level semiconductor package and a method of fabricating the same.

A semiconductor package is provided to implement an integrated circuit chip to qualify for use in electronic products. In general, a semiconductor package is configured such that a semiconductor chip is mounted on a printed circuit board (PCB) and bonding wires or bumps are used to electrically connect the semiconductor chip to the printed circuit board. With the recent development of electronic industry, the semiconductor package is variously developed to reach the goal of compact size, small weight, and/or low manufacturing cost. In addition, many kinds of semiconductor packages have been developed with the expansion of their application field such as high-capacity mass storage devices.

A size of semiconductor chip becomes smaller with high integration of the semiconductor chip. It however is difficult to adhere, handle, and test solder balls due to the small size of the semiconductor chip. Additionally, it occurs problems of acquiring diversified mount board in accordance with the size of the semiconductor chip. A fan-out panel level package (FO-FLP) is proposed to address some of these issues.

SUMMARY

One or more example embodiments provide a semiconductor package with increased reliability and structural stability and a method of fabricating the same.

One or more example embodiments provide a method of fabricating a semiconductor package, in which method the occurrence of defects is reduced and a semiconductor package fabricated by the same.

An object of the present disclosure is not limited to the mentioned above, and other objects which have not been mentioned above will be clearly understood to those skilled in the art from the following description.

According to an aspect of an example embodiment, there is provided a semiconductor package including a redistribution substrate, a connection substrate disposed on the redistribution substrate, the connection substrate having an opening that penetrates the connection substrate, a semiconductor chip disposed in the opening of the connection substrate, and a molding layer that covers the semiconductor chip and the connection substrate, and fills a space between the semiconductor chip and the connection substrate, wherein the connection substrate includes a base layer, a plurality of vias that vertically penetrate the base layer, a plurality of first patterns disposed on a top surface of the base layer and connected to the plurality of vias, respectively, and a plurality of second patterns disposed on a bottom surface of the base layer and connected to the plurality of vias, respectively, wherein an extension of the molding layer extends into a plurality of holes that are spaced apart from the plurality of vias and are formed to vertically penetrate the base layer.

According to another aspect of an example embodiment, there is provided A semiconductor package including a redistribution substrate, a connection substrate disposed on the redistribution substrate, and a molding layer disposed on the redistribution substrate and covering the connection substrate, wherein the connection substrate includes a base layer that has a plurality of first holes and a plurality of second holes, the plurality of first holes and the plurality of second holes vertically penetrating the base layer, a plurality of first patterns disposed on a top surface of the base layer, a plurality of second patterns disposed on a bottom surface of the base layer, the plurality of second patterns separating the base layer from the redistribution substrate, and a plurality of vias that fill the plurality of first holes, the plurality of vias vertically penetrating the base layer and connecting the plurality of first patterns to the plurality of second patterns, respectively, wherein the molding layer fills the plurality of second holes and a space between the base layer and the redistribution substrate, and wherein a bottom surface of the molding layer is coplanar with bottom surfaces of the plurality of second patterns.

According to another aspect of an example embodiment, there is provided a method of fabricating a semiconductor package, the method including forming on a base layer a plurality of first holes that vertically penetrate the base layer, filling the plurality of first holes with a metallic material to form a plurality of vias, forming a plurality of first patterns on a top surface of the base layer and forming and a plurality of second patterns on a bottom surface of the base layer, forming, on the base layer, a plurality of second holes that vertically penetrate the base layer, forming, on the base layer, an opening that penetrates the base layer, providing a carrier substrate on the bottom surface of the base layer, providing a semiconductor chip in the opening, and providing the base layer with a molding member to form a molding layer, wherein the molding member flows into the plurality of second holes and fills the plurality of second holes.

BRIEF DESCRIPTION OF THE DRAWINGS

The above and/or other aspects will become apparent by describing in detail example embodiments with reference to the accompanying drawings, in which

FIGS. 5, 6, 7, 8, 9, 10, 11, 12, 13, and 14 illustrate cross-sectional views showing a method of fabricating a semiconductor package according to an example embodiment;

FIGS. 15, 16, and 17 illustrate cross-sectional views showing a method of fabricating a semiconductor package according an example embodiment; and FIGS. 18, 19, 20, 21, 22, and 23 illustrate cross-sectional views showing a method of fabricating a semiconductor package according to an example embodiment.

DETAILED DESCRIPTION

The following will now describe a semiconductor package according to example embodiments with reference to the accompanying drawings.

Figure 1:
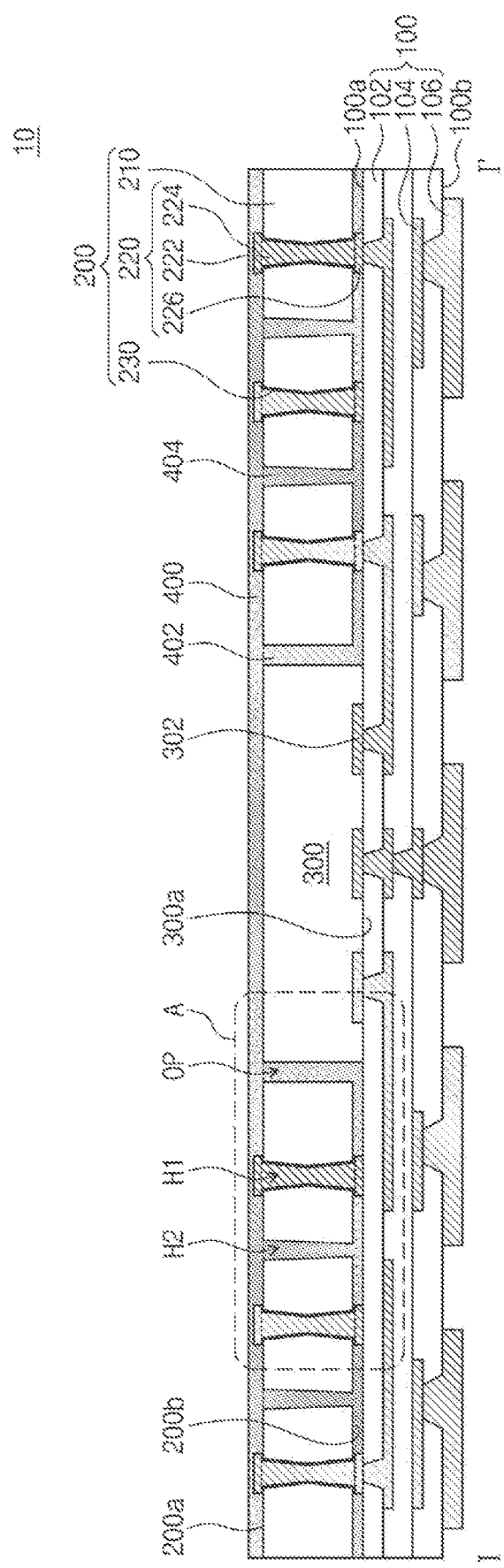
FIG. 1 illustrates a cross-sectional view showing a semiconductor package according an example embodiment.
Figure 2:
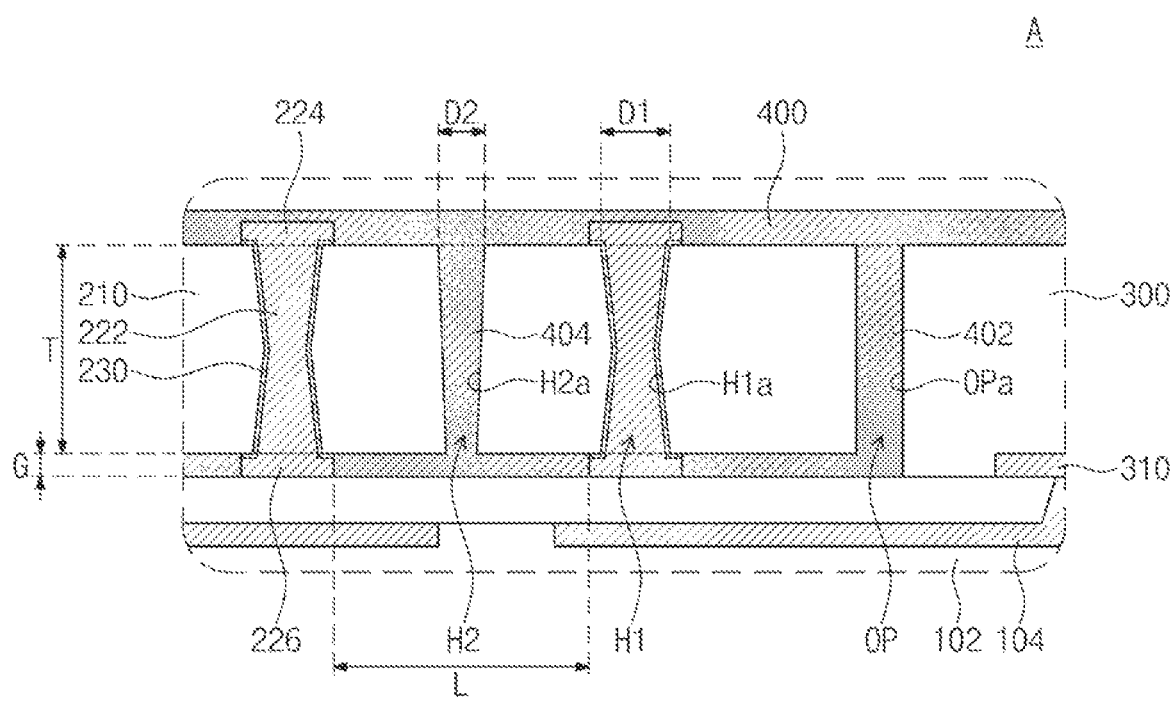
FIG. 2 illustrates an enlarged view showing a portion of FIG. 1.
Figure 3:
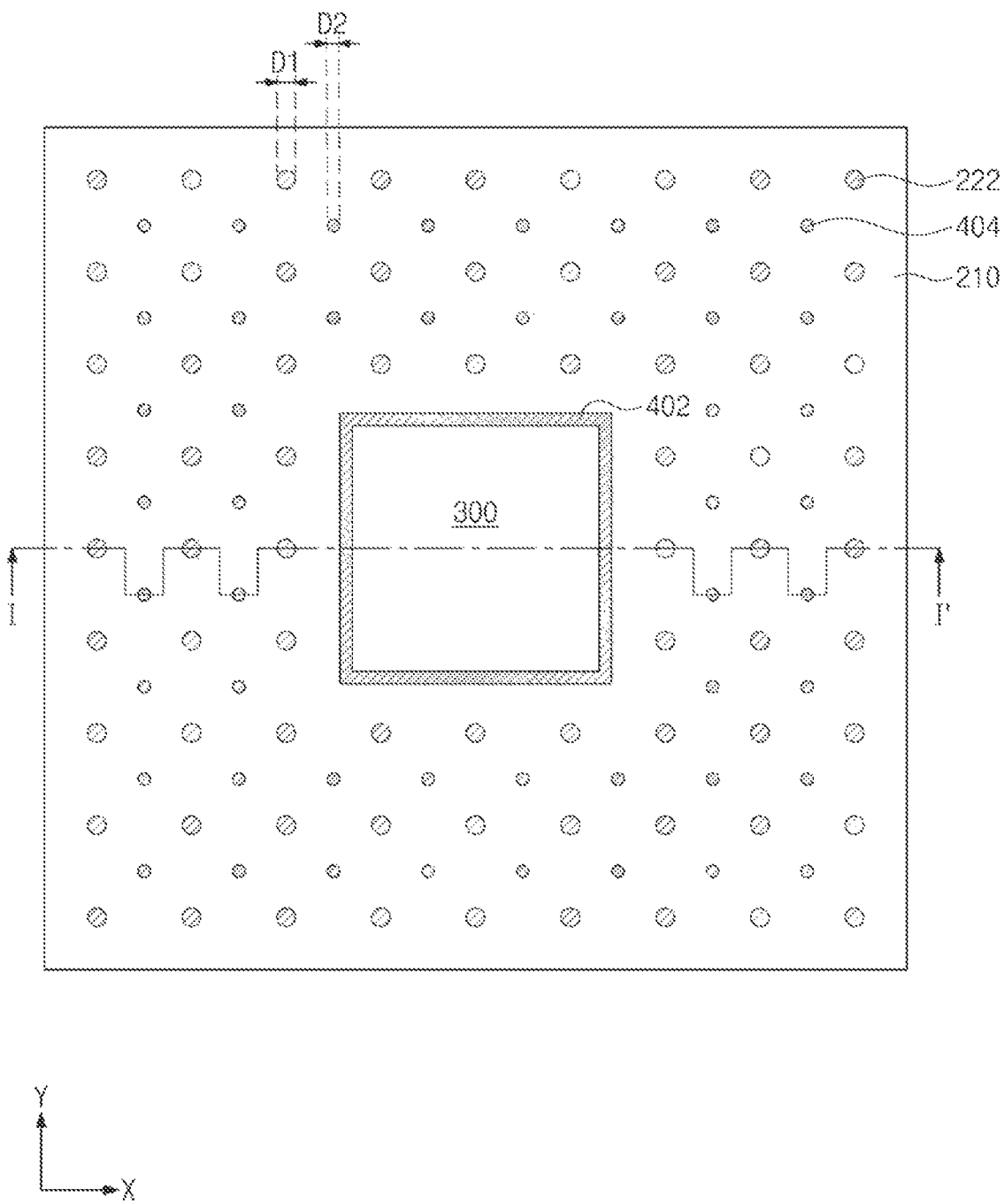
FIG. 3 illustrates a plan view showing a semiconductor package according to an example embodiment.
Figure 4:
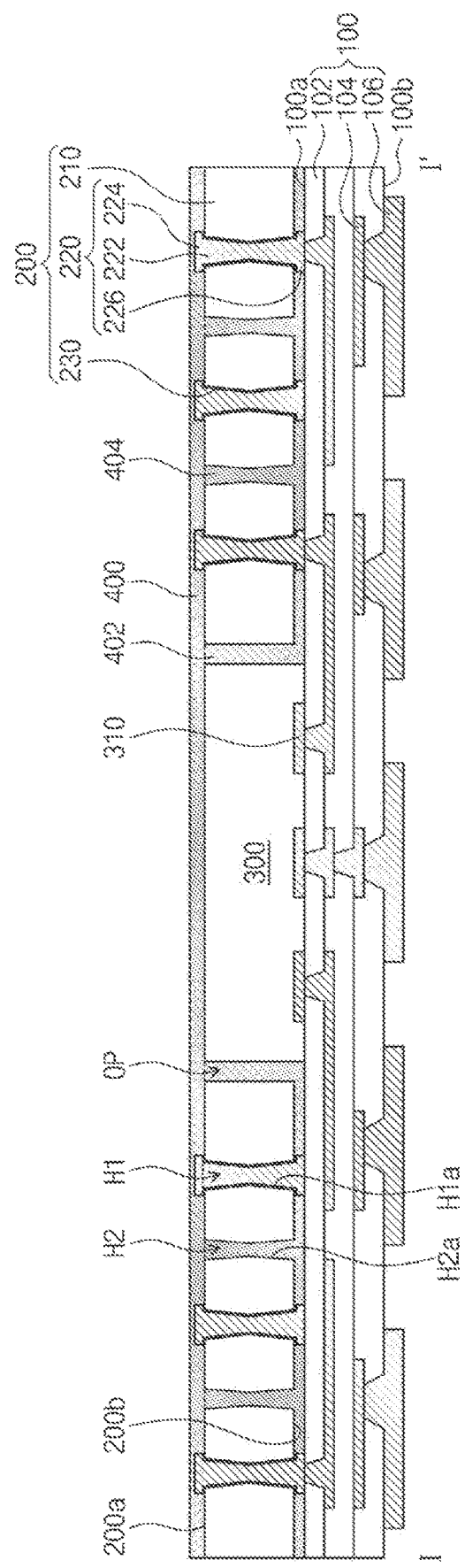
FIG. 4 illustrates a cross-sectional view showing a semiconductor package according to an example embodiment.

FIG. 1 illustrates a cross-sectional view showing a semiconductor package according to an example embodiment. FIG. 2 illustrates an enlarged view showing a portion of FIG. 1. FIG. 3 illustrates a plan view showing a semiconductor package according to an example embodiment, and FIG. 1 corresponds to a cross-sectional view taken along line I-I' of FIG. 3. FIG. 4 illustrates a cross-sectional view showing a semiconductor package according to an example embodiment.

Referring to FIG. 1, a semiconductor package 10 may include a redistribution substrate 100. The redistribution substrate 100 may include dielectric patterns 102 and conductive patterns 104. The conductive patterns 104 may include a conductive layer between the dielectric patterns 102 and a via that penetrates the dielectric patterns 102. The dielectric patterns 102 may include an inorganic dielectric layer formed of silicon oxide (SiOx) or silicon nitride (SiNx). However, embodiments are not limited thereto. For example, the dielectric patterns 102 may include a polymer material. The conductive patterns 104 may be surrounded by the dielectric patterns 102. The conductive patterns 104 may redistribute a semiconductor chip 300 mounted on the redistribution substrate 100. The redistribution substrate 100 may allow the semiconductor package 10 to have a fan-out structure. The conductive patterns 104 may include metal. The conductive patterns 104 may be connected to substrate pads 106 disposed on a bottom surface 100b of the redistribution substrate 100. The redistribution substrate 100 may have a top surface 100a that is substantially flat. A passivation layer may be disposed on the bottom surface 100b of the redistribution substrate 100. The passivation layer may cover the dielectric patterns 102 and the conductive patterns 104, but may expose the substrate pads 106. The passivation layer may include a dielectric polymer such as an epoxy-based polymer, an Ajinomoto build-up film (ABF), an organic material, or an inorganic material. The redistribution substrate 100 may have external terminals on the bottom surface 100b. The external terminals may be disposed on the substrate pads 106. The external terminals may be electrically connected through the substrate pads 106 to the conductive patterns 104.

Referring together to FIGS. 1 and 2, a connection substrate 200 may be disposed on the redistribution substrate 100. The connection substrate 200 may include a base layer 210 and a conductive member 220 in the base layer 210.

The base layer 210 may have a thickness T of about 70 μm to about 300 μm. The base layer 210 may have an opening OP that penetrates therethrough. For example, the opening OP may be shaped like an open hole that mutually connects top surface 200a and bottom surface 200b of the base layer 210. The opening OP may have a first inner surface OPa that is substantially flat. For example, the opening OP may have a width that is constant regardless of a distance from the top surface 100a of the redistribution substrate 100, or differently from that shown, the width of the opening OP may substantially continuously increase with increasing distance from the top surface 100a of the redistribution substrate 100. The base layer 210 may include silicon oxide (SiOx) or a dielectric polymer.

The connection substrate 200 may have, at its outer side, the conductive member 220 provided away from the opening OP which is provided at a central portion of the connection substrate 200. The conductive member 220 may include first patterns 224, through vias 222, and second patterns 226.

The first patterns 224 may be disposed on the top surface 200a of the base layer 210. The first patterns 224 may protrude from the top surface 200a of the base layer 210. According to an example embodiment, different from that shown in FIGS. 1 and 2, the first patterns 224 may not protrude from the top surface 200a of the base layer 210. In this example, the first patterns 224 may be embedded in the base layer 210. The first patterns 224 may operate as pads of the connection substrate 200, and external terminals may be coupled to the first patterns 224 operating as the pads.

The second patterns 226 may be disposed on the bottom surface 200b of the base layer 210. The second patterns 226 may protrude from the bottom surface 200b of the base layer 210. The second patterns 226 may separate the base layer 210 from the redistribution substrate 100. The second patterns 226 may each have a thickness of about 10 μm to about 30 μm. In this case, the redistribution substrate 100 and the base layer 210 may have therebetween an interval G of about 10 μm to about 30 μm. The second patterns 226 may be in contact with and electrically connected to the conductive patterns 104 of the redistribution substrate 100.

The through vias 222 may vertically penetrate the base layer 210, and may electrically connect the first patterns 224 to the second patterns 226. For example, the base layer 210 may have a plurality of first holes H1 that are formed to vertically penetrate the base layer 210, and the through vias 222 may be provided in the first holes H1. The first holes H1 may be spaced apart from the opening OP of the base layer 210. The through vias 222 may have a shape that is tapered toward a center of the base layer 210. For example, when viewed in a cross-section view perpendicular to the top surface 100a of the redistribution substrate 100, the first holes H1 may have their second inner surfaces H1a each of which is a bent surface convexly directed toward an inside of the first hole H1, and the through vias 222 may each have a width D1 that increases as approaching the top surface 200a and the bottom surface 200b of the base layer 210. For example, the through vias 222 may each have an hourglass shape or a bowtie shape. When viewed in a plan view, the width D1 or a diameter of the through via 222 may range from about 50 μm to about 150 μm. For example, the width D1 or the diameter of the through via 222 may range from about 70 μm to about 100 μm. As shown in FIG. 3, the through vias 222 may be arranged along a first direction X and a second direction Y that are parallel to the top surface 100a of the redistribution substrate 100. For example, when viewed in a plan view, the through vias 222 may constitute a plurality of rows and a plurality of columns. The first direction X and the second direction Y may be perpendicular to each other, and the through vias 222 may be arranged in a square grid shape. However, embodiments are not limited thereto, and the through vias 222 may be arranged in, for example, a hexagonal grid shape or in any other shape depending on design of wiring lines in the connection substrate 200.

The through vias 222, the first patterns 224, and the second patterns 226 may include a conductive material. For example, the through vias 222, the first patterns 224, and the second patterns 226 may include copper (Cu). The through vias 222, the first patterns 224, and the second patterns 226 may be formed of the same material. No distinct boundary may be provided between the through vias 222, the first patterns 224, and the second patterns 226, but the present inventive concepts are not limited thereto.

A seed layer 230 may be interposed between the base layer 210 and each of the through via 222, the first pattern 224, and the second pattern 226. For example, the seed layer 230 may surround an outer surface of the through via 222, and may extend between the base layer 210 and each of the first pattern 224 and the second pattern 226. The seed layer 230 may include a metallic material. For example, the seed layer 230 may include at least one selected from titanium (Ti) and tantalum (Ta).

The semiconductor chip 300 may be placed on the redistribution substrate 100. The semiconductor chip 300 may be disposed in the opening OP of the connection substrate 200. When viewed in a plan view, the semiconductor chip 300 may have a planar shape smaller than that of the opening OP. For example, the semiconductor chip 300 may be spaced apart from the first inner surface OPa of the opening OP. The semiconductor chip 300 may have a bottom surface 300a facing the redistribution substrate 100 and a top surface opposite to the bottom surface 300a. The bottom surface 300a of the semiconductor chip 300 may be an active surface. The bottom surface 300a of the semiconductor chip 300 may be in contact with the redistribution substrate 100. Therefore, the bottom surface 300a of the semiconductor chip 300 may be located at a lower level than that of the bottom surface 200b of the base layer 210. The top surface of the semiconductor chip 300 may be located at a level the same as or lower than that of the top surface 200a of the base layer 210. The semiconductor chip 300 may include chip pads 310 disposed in a lower portion of the semiconductor chip 300. The chip pads 310 may be electrically connected to the conductive patterns 104 of the redistribution substrate 100. For example, the chip pads 310 may be in contact with the conductive patterns 104. The semiconductor chip 300 may be a memory chip or an application processor (AP) chip. According to an example embodiment, a plurality of semiconductor chips 300 may be disposed in the opening OP. For example, a plurality of semiconductor chips 300 may be disposed side by side and spaced apart from each other on the redistribution substrate 100.

A molding layer 400 may be disposed on the redistribution substrate 100. The molding layer 400 may cover the connection substrate 200 and the semiconductor chip 300. The molding layer 400 may include a first extension 402 and a second extension 404 that extend toward the redistribution substrate 100 from the top surface 200a of the base layer 210.

The first extension 402 of the molding layer 400 may fill a gap between the connection substrate 200 and the semiconductor chip 300. For example, the first extension 402 of the molding layer 400 may fill an unoccupied portion of the opening OP. The first extension 402 may have a lowermost surface in contact with the top surface 100a of the redistribution substrate 100. The first extension 402 may extend from the opening OP into a gap between the redistribution substrate 100 and the base layer 210 of the connection substrate 200. The lowermost surface of the first extension 402 of the molding layer 400 may be located at the same level as that of bottom surfaces of the second patterns 226 of the connection substrate 200.

The second extension 404 of the molding layer 400 may penetrate the base layer 210. For example, the base layer 210 may have a plurality of second holes H2 that are formed to vertically penetrate the base layer 210, and the second extension 404 may fill the second holes H2. The second holes H2 may be spaced apart from the opening OP of the base layer 210. The second holes H2 may have their third inner surfaces H2a that are substantially flat. For example, the second holes H2 may each have a width D2 that substantially continuously increases with increasing distance from the top surface 100a of the redistribution substrate 100. However, embodiments are not limited thereto. For example, the width D2 of the second hole H2 may be constant regardless of distance from the top surface 100a of the redistribution substrate 100. When viewed in a plan view, the width D2 or a diameter of the second hole H2 may be less than the width D1 or the diameter of the first hole H1. The width D2 of the second hole H2 may range from about 70 µm to about 120 µm. The second holes H2 may each have an aspect ratio of about 1:2 to about 1:5. When viewed in a plan view, the second holes H2 may be alternately disposed between the first holes H1. As shown in FIG. 3, the second hole H2 may be disposed at a central position equally distant from neighboring four first holes H1. Embodiments, however, are not limited thereto, and the second holes H2 may be variously disposed in accordance with an interval or arrangement of the first holes H1. One of the first holes H1 may be positioned between the opening OP and at least one of the second holes H2. A length L between two neighboring ones of the second holes H2 may range from about 100 µm to about 2,000 µm. The aspect ratio of the second hole H2, the width D2 of the second hole H2, and/or the length L between the second holes H2 may depend on a material of the molding layer 400. This will be discussed in detail in explaining a method of fabricating the semiconductor package 10.

FIG. 2 depicts that the third inner surface H2a of the second hole H2 is substantially flat, but embodiments are not limited thereto. Referring to FIG. 4, in the second holes H2, the second extension 404 may have a shape that is tapered toward the center of the base layer 210. For example, when viewed in a cross-section view perpendicular to the top surface 100a of the redistribution substrate 100, the third inner surface H2a of the second hole H2 may be a bent surface convexly directed toward an inside of the second hole H2, and in the second holes H2, the second extension 404 may have a width that increases as approaching the top surface 200a and the bottom surface 200b of the base layer 210. For example, the second holes H2 may each have an hourglass shape or a bowtie shape. The following description will focus on the example embodiment of FIG. 1.

Referring back to FIGS. 1 and 2, the second extension 404 may extend from the second hole H2 into a gap between the redistribution substrate 100 and the base layer 210 of the connection substrate 200. The second extension 404 may fill a gap between the base layer 210 and the redistribution substrate 100, and may surround the second patterns 226 between the base layer 210 and the redistribution substrate 100. For example, the second extension 404 may cover the bottom surface 200b of the base layer 210. The second extension 404 of the molding layer 400 may have a lowermost surface in contact with the top surface 100a of the redistribution substrate 100. In this case, the lowermost surface of the second extension 404 of the molding layer 400 may be coplanar with the bottom surfaces of the second patterns 226 of the connection substrate 200.

According to an example embodiment, the molding layer 400 may pass through the second holes H2 and may fill a gap between the base layer 210 and the redistribution substrate 100. Therefore, as compared with a case where the base layer 210 and the redistribution substrate 100 have an empty space therebetween, the semiconductor package 10 may increase in structural stability. Further, as the dielectric molding layer 400 fills a space between the second patterns 226, it may be possible to prevent short-circuits between the second patterns 226 and to provide the semiconductor package 10 with increased operating reliability and improved electrical characteristics.

The molding layer 400 may include an Ajinomoto build-up film (ABF). However, embodiments are not limited thereto. For example, the molding layer 400 may include a dielectric polymer such as epoxy-based polymer or a high molecular material such as thermo-curable resin. According to an example embodiment, an upper portion of the molding layer 400 may have a recession that exposes the first patterns 224.

FIGS. 5 to 14 illustrate cross-sectional views showing a method of fabricating a semiconductor package according to an example embodiment.

Figure 5:

Referring to FIG. 5, a base layer 210 may be provided. The base layer 210 may include silicon oxide (SiOx) or a dielectric polymer. The base layer 210 may have a thickness of about 70 μm to about 300 μm.

Figure 6:
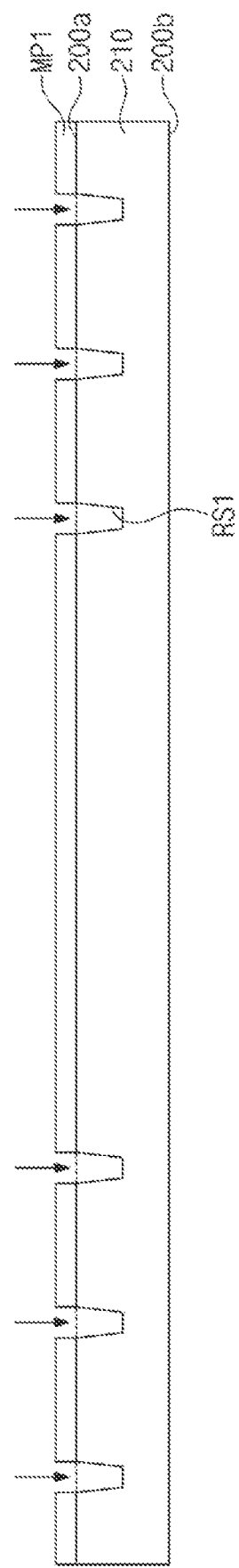

Referring to FIG. 6, first recessions RS1 may be formed on the base layer 210. For example, a first mask pattern MP1 may be formed on a top surface 200a of the base layer 210, and then the first mask pattern MP1 may be used as an etching mask to etch the base layer 210. The first mask pattern MP1 may expose the top surface 200a at an outer side of the base layer 210. The formation of the first recessions RS1 may include an etching process, such as a drilling process. At this step, based on characteristics of the etching process or material properties (e.g., hardness) of the base layer 210 as an etching target, the first recessions RS1 may be formed to each have a width that decreases as approaching a bottom surface 200b of the base layer 210. The first recessions RS1 may not penetrate the base layer 210.

Referring to FIG. 7, the first mask pattern MP1 may be removed from a resultant structure of FIG. 6.

Second recessions RS2 may be formed on the base layer 210. For example, a second mask pattern MP2 may be formed on the bottom surface 200b of the base layer 210, and then the second mask pattern MP2 may be used as an etching mask to etch the base layer 210. The second mask pattern MP2 may expose the bottom surface 200b at an outer side of the base layer 210. The formation of the second recessions RS2 may include the same process as that used for the formation of the first recessions RS1. For example, the formation of the second recessions RS2 may include a drilling process. The second recessions RS2 may be formed to each have a width that decreases as approaching the top surface 200a of the base layer 210. The second recessions RS2 may not penetrate the base layer 210. In the formation of the second recessions RS2, when viewed in a plan view, the second mask pattern MP2 may have an etching pattern the same as that of the first mask pattern MP1. For example, when viewed in a plan view, the second recessions RS2 may overlap the first recessions RS1, and may be spatially connected to corresponding first recessions RS1. One of the first recessions RS1 and one of the second recessions RS2 may be spatially connected to each other to constitute a single first hole H1. The first hole H1 may be the same as that discussed with reference to FIG. 1.

Referring to FIG. 8, the second mask pattern MP2 may be removed from a resultant structure of FIG. 7.

A conductive layer 240 may be formed on the base layer 210. For example, a seed layer 230 may be formed on the base layer 210. The seed layer 230 may be formed to conformally cover the top surface 200a of the base layer 210, the bottom surface 200b of the base layer 210, and second inner surfaces of the first holes H1. The seed layer 230 may include a metallic material. For example, the seed layer 230 may include at least one selected from titanium (Ti) and tantalum (Ta).

Afterwards, the conductive layer 240 may be formed on the seed layer 230. The conductive layer 240 may be formed by a plating process. For example, a plating process may be performed to fill the first holes H1 with a metallic material which may cover the top surface 200a and the bottom surface 200b of the base layer 210. Portions of the conductive layer 240 that fills the first holes H1 may constitute through vias 222. The plating process may include a metal electroless plating process or a metal electroplating process. The plating process may use the seed layer 230 as an electrode.

Figure 9:
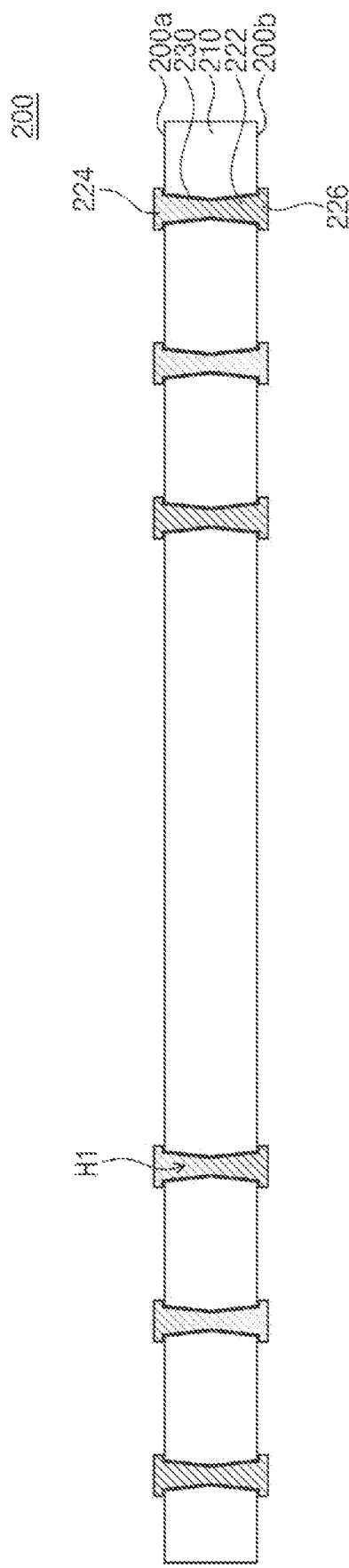

Referring to FIG. 9, first patterns 224 and second patterns 226 may be formed. For example, the seed layer 230 and the conductive layer 240 may be patterned. To be specific, an etching process may be performed to etch the seed layer 230 and the conductive layer 240 positioned on the top surface 200a and the bottom surface 200b of the base layer 210. The first patterns 224 may be constituted by portions of the conductive layer 240 that remains on the top surface 200a of the base layer 210, and the second patterns 226 may be constituted by portions of the conductive layer 240 that remains on the bottom surface 200b of the base layer 210. A step difference may be formed between the first patterns 224 and the top surface 200a of the base layer 210, and a step difference may also be formed between the second patterns 226 and the bottom surface 200b of the base layer 210.

As discussed with reference to FIGS. 5 to 9, a connection substrate 200 may be formed. For example, the base layer 210, the through vias 222, the first patterns 224, and the second patterns 226 may constitute the connection substrate 200.

According to another example embodiment, the first pattern 224 and the second pattern 226 may be formed by a lift-off method. For example, before the seed layer 230 is formed, a sacrificial layer may be formed on the top surface 200a and the bottom surface 200b of the base layer 210. The seed layer 230 and the conductive layer 240 may be formed on the sacrificial layer. Thereafter, the sacrificial layer may be removed. At this step, the seed layer 230 and the conductive layer 240 that are positioned on the sacrificial layer may also be partially removed to form the first patterns 224 and the second patterns 226.

Figure 10:
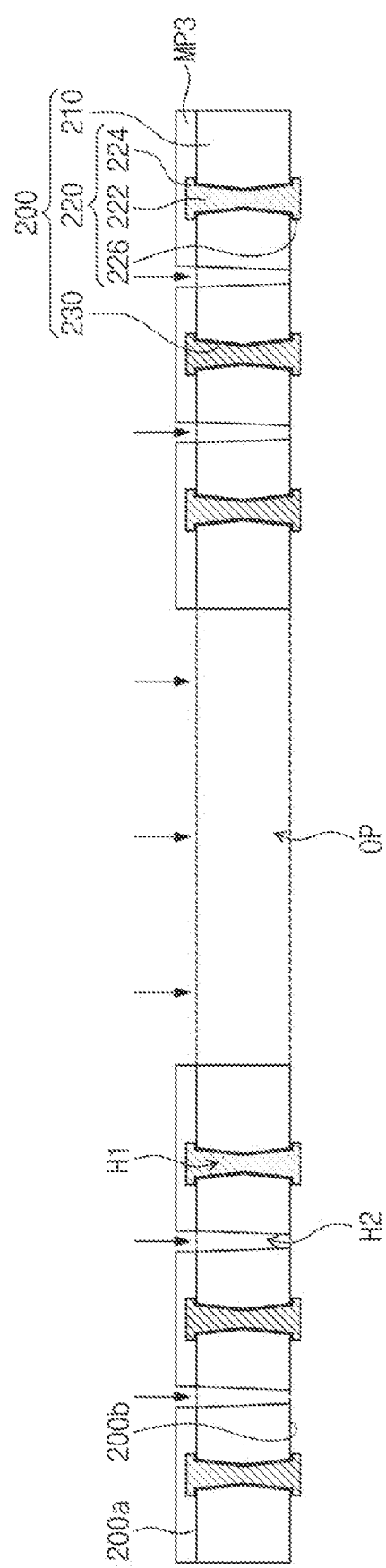

Referring to FIG. 10, an opening OP may be formed on the connection substrate 200. A partial region of the base layer 210 may be removed to form the opening OP that penetrates the base layer 210. For example, a third mask pattern MP3 may be formed on the connection substrate 200, and then the third mask pattern MP3 may be used as an etching mask to etch the partial region of the base layer 210. The third mask pattern MP3 may cover the first patterns 224, but may expose a central part of the base layer 210. The opening OP may be formed by, for example, an etching process such as drilling, laser ablation, or laser cutting. The removed partial region of the base layer 210 may be a space in which a semiconductor chip 300 will be provided in a subsequent process. The opening OP may be shaped like an open hole that mutually connects the top surface 200a and the bottom surface 200b of the base layer 210.

During the formation of the opening OP, second holes H2 may be formed simultaneously. For example, the third mask pattern MP3 may expose the top surface 200a of the base layer 210 between the first patterns 224. Therefore, during the formation of the opening OP, the second holes H2 may be formed alternately between the first patterns 224. The formation of the second holes H2 may include an etching process, such a drilling process. At this step, based on characteristics of the etching process or material properties of the base layer 210 as an etching target, the second holes H2 may be formed to each have a width that decreases as approaching the bottom surface 200b of the base layer 210. The second holes H2 may be formed to vertically penetrate the base layer 210.

Figure 11:
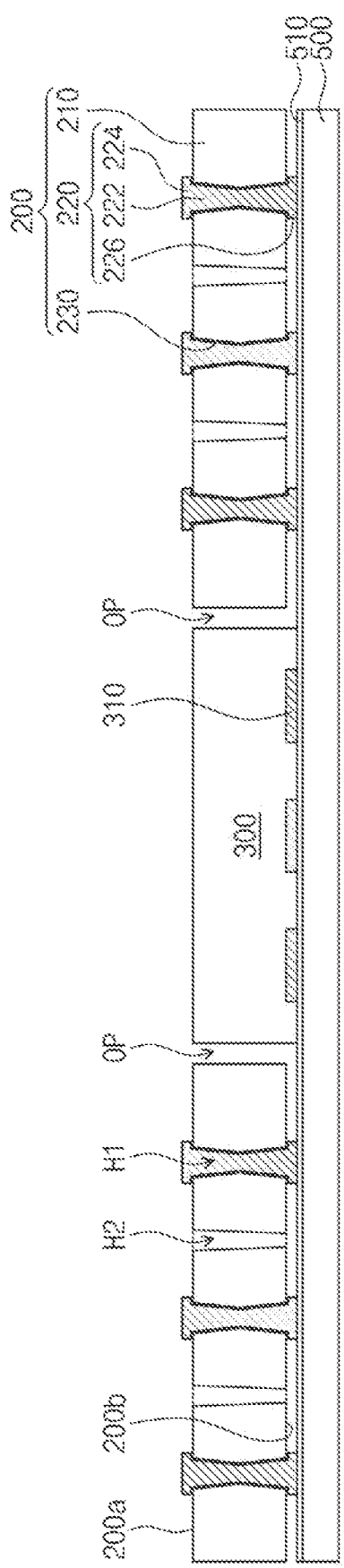

Referring to FIG. 11, the third mask pattern MP3 may be removed from a resultant structure of FIG. 10.

A carrier substrate 500 may be provided on the connection substrate 200. The connection substrate 200 may be attached to the carrier substrate 500. For example, as shown in FIG. 11, the carrier substrate 500 may include an adhesive member 510 provided on a top surface of the carrier substrate 500. According to another example embodiment, the carrier substrate 500 may include an adhesive tape. The second patterns 226 of the connection substrate 200 may be attached to the carrier substrate 500, and may separate the base layer 210 from the adhesive member 510.

A semiconductor chip 300 may be provided on the carrier substrate 500. The semiconductor chip 300 may be disposed in the opening OP of the connection substrate 200. At this step, the semiconductor chip 300 may be adhered to the carrier substrate 500. The semiconductor chip 300 may include chip pads 310 disposed on a bottom surface thereof.

Figure 12:
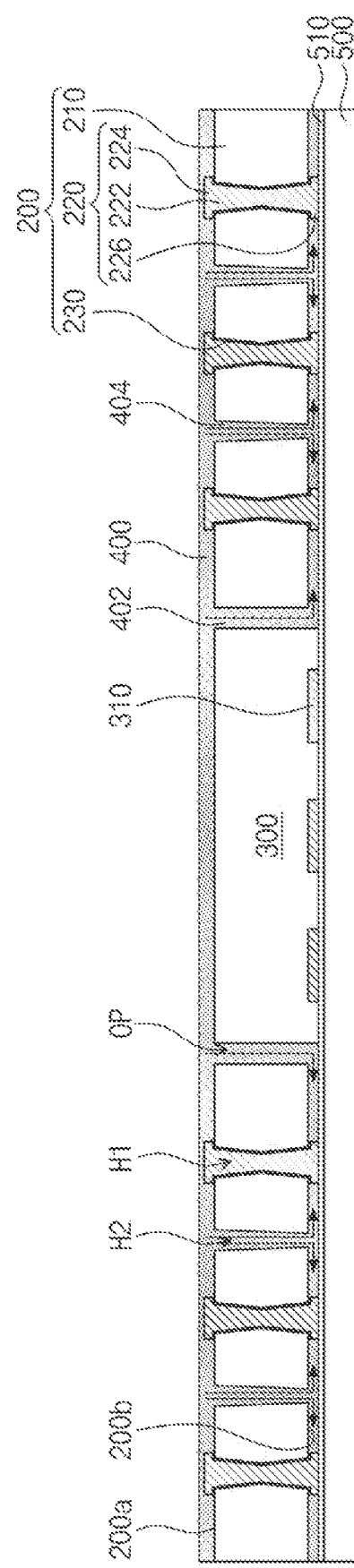

Referring to FIG. 12, a molding layer 400 may be formed on the carrier substrate 500. For example, a molding member may be coated on the connection substrate 200 and the semiconductor chip 300, and then the molding member may be cured to form the molding layer 400.

The molding member may fill a gap between the connection substrate 200 and the semiconductor chip 300. For example, as designated by arrows in figures, the molding member coated on the connection substrate 200 and the semiconductor chip 300 may be introduced into a space between the connection substrate 200 and the carrier substrate 500 after passing through a gap between the semiconductor chip 300 and the connection substrate 200. At this step, in the gap between the connection substrate 200 and the semiconductor chip 300, the molding member may flow along a direction toward the carrier substrate 500, and in the space between the connection substrate 200 and the carrier substrate 500, the molding member may flow along a direction toward an outer side of the carrier substrate 500. The molding member introduced into the gap between the connection substrate 200 and the semiconductor chip 300 may form a first extension 402 of the molding layer 400 as discussed above with reference to FIG. 1.

In addition, the molding member may fill the second holes H2. For example, as designated by arrows in figures, the molding member coated on the connection substrate 200 may be introduced through the second holes H2 into the space between the connection substrate 200 and the carrier substrate 500. At this step, the molding member may flow along a direction from the second holes H2 toward the carrier substrate 500, and between the connection substrate 200 and the carrier substrate 500, the molding member may flow along direction toward the outer side of the carrier substrate 500. The molding member may surround the second patterns 226. At this step, the introduction of the molding member may be difficult when the second holes H2 have their narrow widths, the second holes H2 have their relatively large aspect ratios, or the connection substrate 200 and the carrier substrate 500 have a narrow gap therebetween. The second holes H2 may each have a width D2 of about 70 μm to about 120 μm. The second holes H2 may each have an aspect ratio of about 1:2 to about 1:5. A thickness of the second patterns 26 may be set to about 10 μm to about 30 μm that define the space between the connection substrate 200 and the carrier substrate 500. The molding member introduced into the second holes H2 may form a second extension 404 of the molding layer 400 as discussed with reference to FIG. 1.

According to an example embodiment, the through vias 222, the first patterns 224, and the second patterns 226 of the connection substrate 200 may be formed through plating and patterning processes each of which is performed once on the base layer 210, which may result in simplification of process for semiconductor package fabrication. Moreover, as the second holes H2 are formed in the connection substrate 200, the molding member may more easily flow into the space between the connection substrate 200 and the carrier substrate 500. Accordingly, the molding layer 400 may entirely cover the bottom surface 200b of the base layer 210 which, together with the second patterns 226, forms the step difference, and a bottom surface of the molding layer 400 formed of the cured molding member may be coplanar with those of the second patterns 226.

The molding member may include an Ajinomoto build-up film (ABF). According to another example embodiment, the molding member may include a dielectric polymer such as epoxy-based polymer or a high molecular material such as thermo-curable resin.

Figure 13:
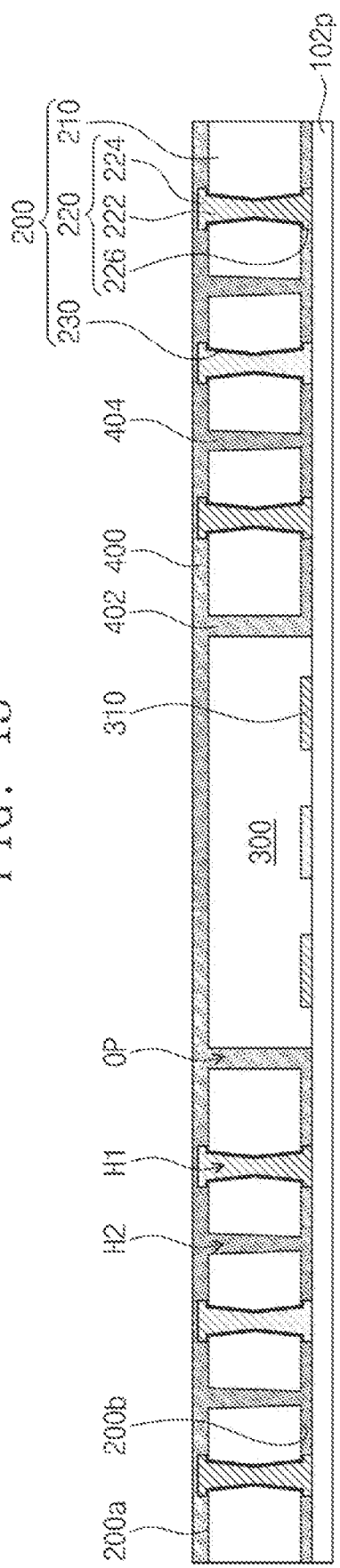

Referring to FIG. 13, the carrier substrate 500 may be removed from a resultant structure of FIG. 12. The removal of the carrier substrate 500 may expose a bottom surface of the semiconductor chip 300, the bottom surface of the molding layer 400, and the bottom surfaces of the second patterns 226. At this step, the adhesive member 510 may also be removed together with the carrier substrate 500.

A dielectric layer 102p may be formed on the bottom surface of the semiconductor chip 300 and the bottom surface 200b of the base layer 210. The dielectric layer 102p may be a layer for forming one of the dielectric patterns 102 of the redistribution substrate 100 discussed with reference to FIG. 1. As the bottom surface of the molding layer 400, the bottom surfaces of the second patterns 226, and the bottom surface of the semiconductor chip 300 are coplanar with each other, the dielectric layer 102p may be formed to have a plate shape whose top and bottom surfaces are flat.

Figure 14:
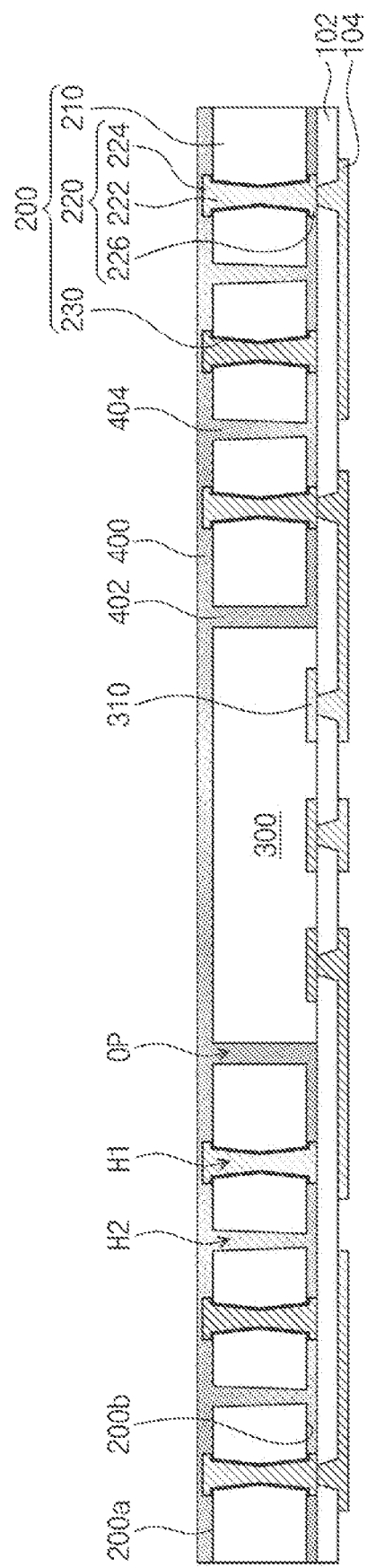

Referring to FIG. 14, the dielectric layer 102p may be patterned to form a dielectric pattern 102 that exposes the second patterns 226 and the chip pads 310 of the semiconductor chip 300. Thereafter, a conductive layer may be formed on a bottom surface of the dielectric pattern 102, and then the conductive layer may be patterned to from a conductive pattern 104. The conductive pattern 104 may be one of the conductive patterns 104 of the redistribution substrate 100 discussed with reference to FIG. 1.

According to an example embodiment, the dielectric layer 102p may be formed to have a plate shape whose top and bottom surfaces are flat, the dielectric layer 102p may be more easily patterned, and the subsequently formed conductive layer may also be more easily patterned. Accordingly, the occurrence of defects may be reduced in fabricating a semiconductor package.

The formation of the dielectric pattern 102 and the conductive pattern 104 may be repeatedly performed as described with reference to FIGS. 13 and 14. A plurality of dielectric patterns 102 and a plurality of conductive patterns 104 may constitute the redistribution substrate 100 as shown in FIG. 1.

After that, as shown in FIG. 1, substrate pads 106 connected to the conductive patterns 104 may be formed on a bottom surface of the redistribution substrate 100. The processes discussed above may eventually fabricate the semiconductor package 10 discussed with reference to FIG. 1.

Figure 17:
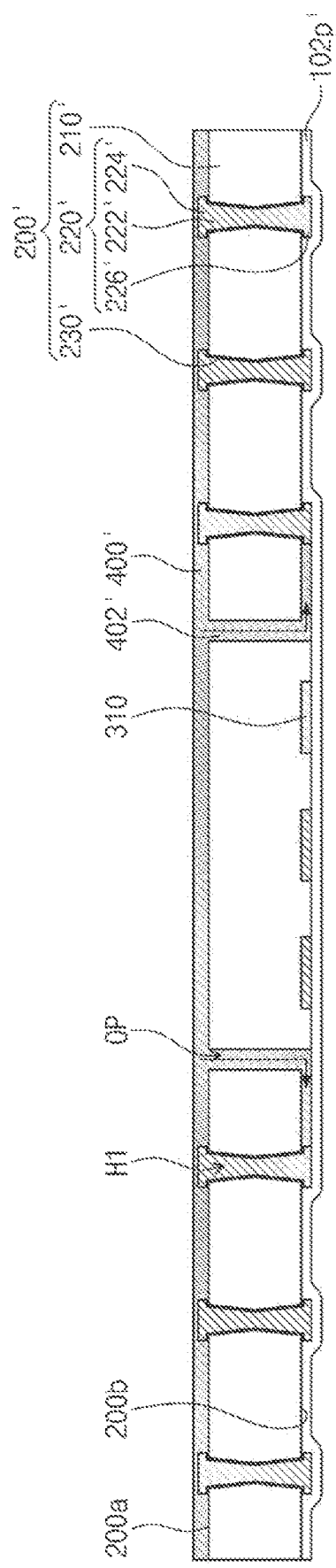

FIGS. 15 to 17 illustrate cross-sectional views of a method of fabricating a semiconductor package according to another example embodiment where no second holes are formed in a connection substrate.

Referring to FIG. 15, a connection substrate 200' may be provided. No second holes may be formed on the connection substrate 200' in the opening formation process described with reference to FIG. 10. The connection substrate 200' may be provided on a carrier substrate 500. Thereafter, a semiconductor chip 300 may be provided on the carrier substrate 500. The semiconductor chip 300 may be provided in an opening OP' of the connection substrate 200'.

Referring to FIG. 16, a molding layer 400' may be formed on the carrier substrate 500. For example, a molding member may be coated on the connection substrate 200' and the semiconductor chip 300, and then the molding member may be cured to form the molding layer 400'.

The molding member may fill a gap between the connection substrate 200' and the semiconductor chip 300. For example, as designated by arrows in figures, the molding member coated on the connection substrate 200' and the semiconductor chip 300 may be introduced into a space between the connection substrate 200' and the carrier substrate 500 after passing through a gap between the semiconductor chip 300 and the connection substrate 200'. At this step, in the gap between the connection substrate 200' and the semiconductor chip 300, the molding member may flow along a direction toward the carrier substrate 500, and in the space between the connection substrate 200' and the carrier substrate 500, the molding member may flow along a direction toward an outer side of the carrier substrate 500. A narrow space may be provided between the connection substrate 200' and the carrier substrate 500. At this step, wettability of the molding member may determine a flow distance of the molding member which depends on the space between the connection substrate 200' and the carrier substrate 500. Moreover, the flow distance of the molding member may become reduced due to resistance at a top surface of the carrier substrate 500 and resistance at a bottom surface of the connection substrate 200'. Therefore, between the connection substrate 200' and the carrier substrate 500, only a space adjacent to the semiconductor chip 300 may be filled with the molding member, and a space between adjacent second patterns 226' may be empty. Therefore, a step difference may be formed between the second patterns 226' and a bottom surface of a base layer 210'.

Referring to FIG. 17, the carrier substrate 500 may be removed from a resultant structure of FIG. 16. The removal of the carrier substrate 500 may expose a bottom surface of the semiconductor chip 300, a bottom surface of the molding layer 400', and bottom surfaces of the second patterns 226'. At this step, the adhesive member 510 may also be removed together with the carrier substrate 500.

A dielectric layer 102p' may be formed on the bottom surface of the semiconductor chip 300 and a bottom surface 200b of a base layer 210'. The dielectric layer 102p' may conformally cover the bottom surface 200b of the base layer 210', the bottom surfaces of the second patterns 226', the bottom surface of the molding layer 400', and the bottom surface of the semiconductor chip 300. As a step difference is formed between the second patterns 226' and the bottom surface 200b of the base layer 210', the dielectric layer 102p' may not be formed to be flat but to be crooked. When the dielectric layer 102p' is formed crooked on a bottom surface of the dielectric layer 102p', defect errors may occur in subsequent processes where the dielectric layer 102p' is patterned and a conductive pattern is formed. Such defect may result in a semiconductor package that may suffer from failure.

FIGS. 5 to 14 show that first holes are formed, and thereafter an opening and second holes are formed together, but embodiments are not limited thereto. FIGS. 18 to 23 illustrate cross-sectional views showing a method of fabricating a semiconductor package according to an example embodiment.

Figure 18:
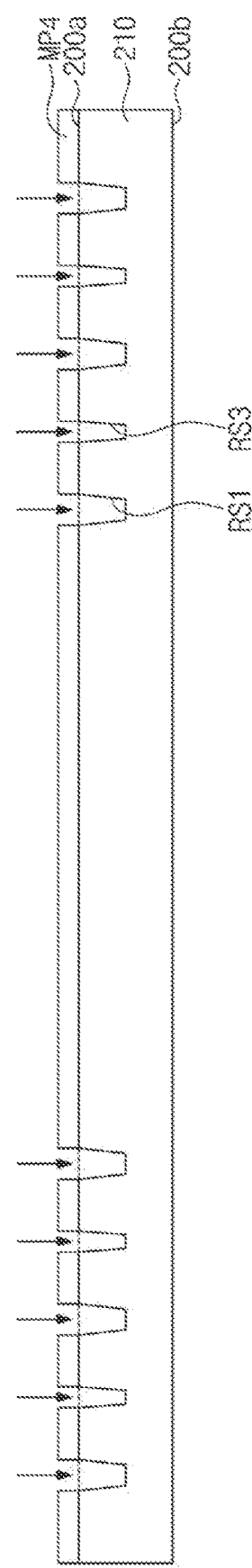

Referring to FIG. 18, a base layer 210 may be provided. First recessions RS1 and third recessions RS3 may be formed on the base layer 210. For example, a fourth mask pattern MP4 may be formed on a top surface 200a of the base layer 210, and then the fourth mask pattern MP4 may be used as an etching mask to etch the base layer 210. When viewed in a plan view, the third recessions RS3 may be alternately formed between the first recessions RS1. The formation of the first recession RS1 and the third recession RS3 may include an etching process, such as a drilling process. At this step, based on characteristics of the etching process or material properties of the base layer 210 as an etching target, the first recession RS1 and the third recession RS3 may be formed to each have a width that decreases as approaching a bottom surface 200b of the base layer 210. The first recession RS1 and the third recession RS3 may not penetrate the base layer 210.

Figure 19:
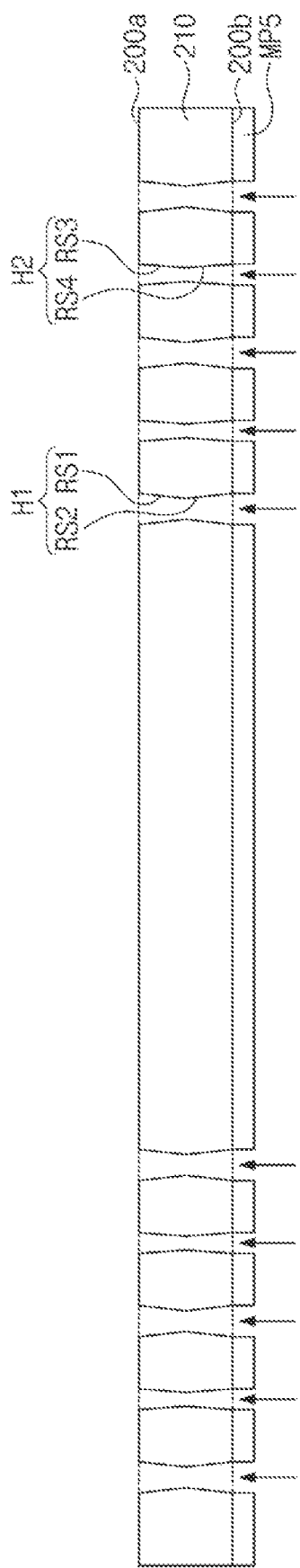

Referring to FIG. 19, the fourth mask pattern MP4 may be removed from a resultant structure of FIG. 18.

Second recessions RS2 and fourth recessions RS4 may be formed on the base layer 210. For example, a fifth mask pattern MP5 may be formed on the bottom surface 200b of the base layer 210, and then the fifth mask pattern MP5 may be used as an etching mask to etch the base layer 210. The formation of the second recession RS2 and the fourth recession RS4 may include an etching process, such as a drilling process. The second recession RS2 and the fourth recession RS4 may be formed to each have a width that decreases as approaching the top surface 200a of the base layer 210. The second recession RS2 and the fourth recession RS4 may not penetrate the base layer 210. In the formation of the second recession RS2 and the fourth recession RS4, when viewed in a plan view, the fifth mask pattern MP5 may have an etching pattern that corresponds to that of the fourth mask pattern MP4. For example, when viewed in a plan view, the second recessions RS2 may overlap the first recessions RS1, and may be spatially connected to corresponding first recessions RS1. When viewed in a plan view, the fourth recessions RS4 may overlap the third recessions RS3, and may be spatially connected to corresponding third recessions RS3. One of the first recessions RS1 and one of the second recessions RS2 may be spatially connected to each other to constitute a single first hole H1. The first hole H1 may be the same as to the first hole H1 as shown in FIG. 1. One of the third recessions RS3 and one of the fourth recessions RS4 may be spatially connected to each other to constitute a single second hole H2. The second hole H2 may be the same as the second hole H2 as shown in FIG. 4.

Figure 20:
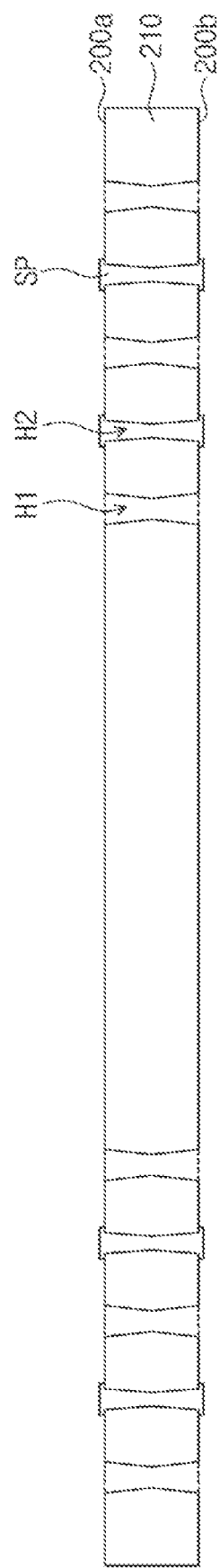

Referring to FIG. 20, the fifth mask pattern MP5 may be removed from a resultant structure of FIG. 19.

A sacrificial pattern SP may be formed on the base layer 210. The sacrificial pattern SP may be formed to partially cover the top surface 200a and the bottom surface 200b of the base layer 210. For example, on the top surface 200a and the bottom surface 200b of the base layer 210, the sacrificial pattern SP may cover the second holes H2, and may expose the first holes H1. The sacrificial pattern SP may fill the second holes H2.

Figure 21:
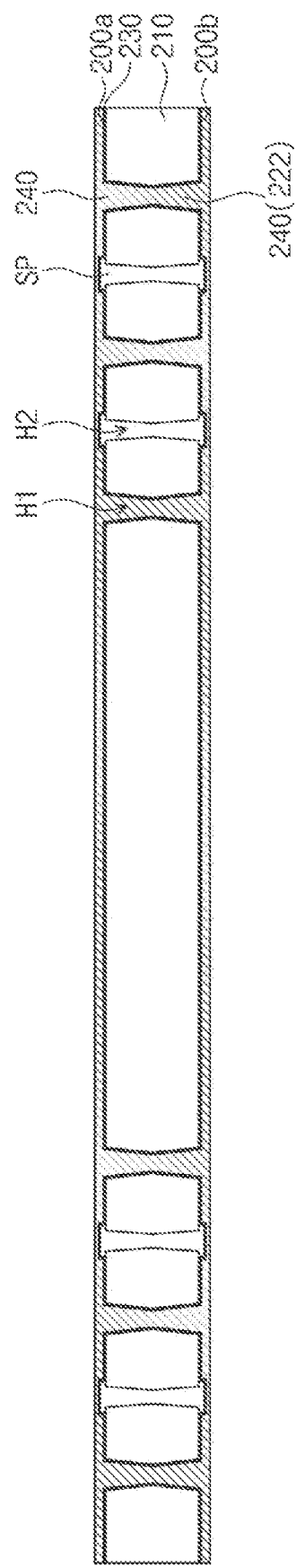

Referring to FIG. 21, a conductive layer 240 may be formed on the base layer 210. For example, a seed layer 230 may be formed on the base layer 210. The seed layer 230 may be formed to conformally cover the top surface 200a of the base layer 210, the bottom surface 200b of the base layer 210, and second inner surfaces of the first holes H1.

Afterwards, the conductive layer 240 may be formed on the seed layer 230. The conductive layer 240 may be formed by a plating process. For example, a plating process may be performed to fill the first holes H1 with a metallic material which may cover the top surface 200a and the bottom surface 200b of the base layer 210. The sacrificial pattern SP may prevent the second holes H2 from being filled with the metallic material. Portions of the conductive layer 240 that fills the first holes H1 may constitute through vias 222. The plating process may include a metal electroless plating process or a metal electroplating process. The plating process may use the seed layer 230 as an electrode.

Figure 22:
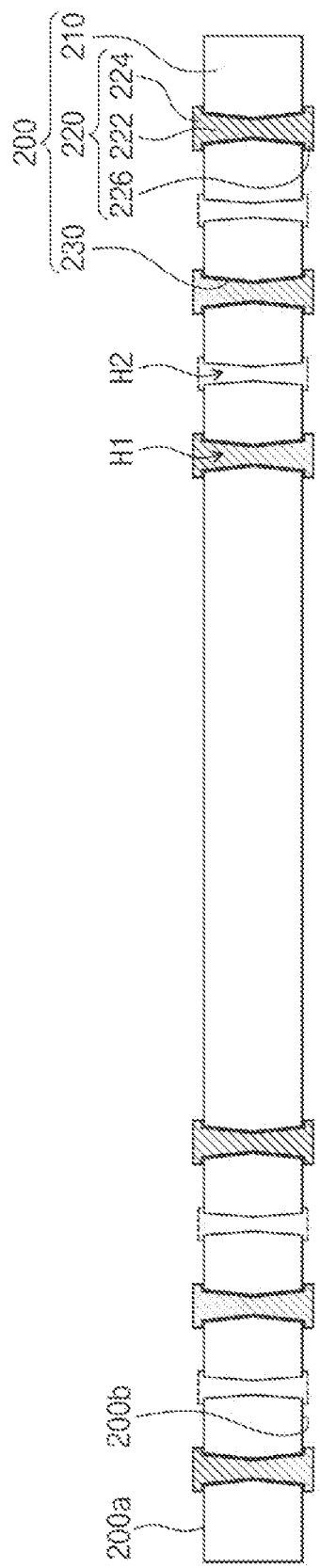

Referring to FIG. 22, first patterns 224 and second patterns 226 may be formed. For example, the seed layer 230 and the conductive layer 240 may be patterned. For example, an etching process may be performed to etch the seed layer 230 and the conductive layer 240 positioned on the top surface 200a and the bottom surface 200b of the base layer 210. The first patterns 224 may be constituted by portions of the conductive layer 240 that remains on the top surface 200a of the base layer 210, and the second patterns 226 may be constituted by portions of the conductive layer 240 that remains on the bottom surface 200b of the base layer 210. A step difference may be formed between the first patterns 224 and the top surface 200a of the base layer 210, and a step difference may also be formed between the second patterns 226 and the bottom surface 200b of the base layer 210.

Thereafter, the sacrificial pattern SP may be removed to expose the second holes H2. Through the processes above with reference to FIGS. 18-22, a connection substrate 200 may be formed.

Referring to FIG. 23, an opening OP may be formed on the connection substrate 200. A partial region of the base layer 210 may be removed to form the opening OP that penetrates the base layer 210. For example, a sixth mask pattern MP6 may be formed on the connection substrate 200, and then the sixth mask pattern MP6 may be used as an etching mask to etch the partial region of the base layer 210. The sixth mask pattern MP6 may cover the first patterns 224 and the second holes H2, but may expose a central part of the base layer 210. The opening OP may be formed by, for example, an etching process such as drilling, laser ablation, or laser cutting. The opening OP may be shaped like an open hole that mutually connects the top surface 200a and the bottom surface 200b of the base layer 210.

Afterwards, processes the same as or similar to those described with reference to FIGS. 11 to 14 may be performed to form the semiconductor package of FIG. 4.

According to example embodiments, a semiconductor package may be configured such that a molding layer passes through second holes and may fill a gap between a base layer and a redistribution substrate. Therefore, as compared with a semiconductor package where the base layer and the redistribution substrate have an empty space therebetween, the semiconductor package may increase in structural stability. Further, as a dielectric molding layer fills a space between second patterns, it may be possible to prevent short-circuits between the second patterns and to provide the semiconductor package with increased operating reliability and improved electrical characteristics.

According to example embodiments, coating and patterning processes of a conductive material may each be performed once to form through vias, first patterns, and second patterns of a connection substrate, which may result in simplification of process for semiconductor package fabrication.

Moreover, as a molding member is more easily introduced through second holes into a space between the connection substrate and a carrier substrate, bottom surfaces of the second patterns may be coplanar with a bottom surface of a molding layer formed of a cured molding member. A dielectric layer may be formed to have a plate shape whose top and bottom surfaces are flat, the dielectric layer may be more easily patterned, and a subsequently formed conductive layer may be more easily patterned. Accordingly, the occurrence of defects may be reduced in semiconductor package fabrication.

While example embodiments have been described with reference to the drawings, it will be understood by one of ordinary skill in the art that variations in form and detail may be made therein without departing from the spirit and essential feature, as set forth in the following claims.

What is claimed is:

1. A semiconductor package comprising:
a redistribution substrate;
a connection substrate disposed on the redistribution substrate, the connection substrate having an opening that penetrates the connection substrate;
a semiconductor chip disposed in the opening of the connection substrate; and
a molding layer that covers the semiconductor chip and the connection substrate, and fills a space between the semiconductor chip and the connection substrate,
wherein the connection substrate comprises:
a base layer;
a plurality of vias that vertically penetrate the base layer;
a plurality of first patterns disposed on a top surface of the base layer and connected to the plurality of vias, respectively; and
a plurality of second patterns disposed on a bottom surface of the base layer and connected to the plurality of vias, respectively,
wherein an extension of the molding layer extends into a plurality of holes that are spaced apart from the plurality of vias and are formed to vertically penetrate the base layer,
wherein, when viewed in a plan view, the plurality of holes are alternately positioned between the plurality of vias.

2. The semiconductor package of claim 1, wherein the extension of the molding layer is in contact with a top surface of the redistribution substrate.

3. The semiconductor package of claim 1, wherein the bottom surface of the base layer is spaced apart from a top surface of the redistribution substrate.

4. The semiconductor package of claim 3, wherein the extension of the molding layer passes through the plurality of holes and fills a space between the bottom surface of the base layer and the top surface of the redistribution substrate.

5. The semiconductor package of claim 4, wherein the extension of the molding layer covers the bottom surface of the base layer, and
wherein a bottom surface of the extension of the molding layer is coplanar with bottom surfaces of the plurality of second patterns.

6. The semiconductor package of claim 3, wherein the extension of the molding layer surrounds the plurality of second patterns between the base layer and the redistribution substrate.

7. The semiconductor package of claim 3, wherein the molding layer extends from the space between the connection substrate and the semiconductor chip toward a space between the connection substrate and the redistribution substrate.

8. The semiconductor package of claim 3, wherein a thickness of a space between the connection substrate and the redistribution substrate is in a range of 10 μm to 30 μm.

9. The semiconductor package of claim 1, wherein, when viewed in the plan view, the plurality of vias are disposed along a first direction and a second direction that are parallel to a top surface of the connection substrate, and
wherein each of the plurality of holes is disposed between four neighboring ones of the plurality of holes.

10. The semiconductor package of claim 1, wherein, when viewed in a cross-section view perpendicular to a top surface of the redistribution substrate, a first inner surface of the opening is substantially flat, and
wherein each of the plurality of vias and each of the plurality of holes have a width that increases toward the top surface of the base layer and the bottom surface of the base layer.

11. A semiconductor package comprising:
a redistribution substrate;
a connection substrate disposed on the redistribution substrate, the connection substrate having an opening that penetrates the connection substrate;
a semiconductor chip disposed in the opening of the connection substrate; and
a molding layer that covers the semiconductor chip and the connection substrate, and fills a space between the semiconductor chip and the connection substrate,
wherein the connection substrate comprises:
a base layer;
a plurality of vias that vertically penetrate the base layer;
a plurality of first patterns disposed on a top surface of the base layer and connected to the plurality of vias, respectively; and
a plurality of second patterns disposed on a bottom surface of the base layer and connected to the plurality of vias, respectively,
wherein an extension of the molding layer extends into a plurality of holes that are spaced apart from the plurality of vias and are formed to vertically penetrate the base layer,
wherein, when viewed in a cross-section view perpendicular to a top surface of the redistribution substrate, a first inner surface of the opening and a second inner surface of each of the plurality of holes are substantially flat, and
wherein each of the plurality of vias has a width that increases toward the top surface of the base layer and the bottom surface of the base layer.

12. The semiconductor package of claim 1, wherein a distance between two neighboring ones of the plurality of holes is in a range of 100 μm to 2,000 μm.

13. A semiconductor package comprising:
a redistribution substrate;
a connection substrate disposed on the redistribution substrate; and
a molding layer disposed on the redistribution substrate and covering the connection substrate,
wherein the connection substrate comprises:
a base layer that has a plurality of first holes and a plurality of second holes, the plurality of first holes and the plurality of second holes vertically penetrating the base layer;
a plurality of first patterns disposed on a top surface of the base layer;
a plurality of second patterns disposed on a bottom surface of the base layer, the plurality of second patterns separating the base layer from the redistribution substrate; and
a plurality of vias that fill the plurality of first holes, the plurality of vias vertically penetrating the base layer and connecting the plurality of first patterns to the plurality of second patterns, respectively,
wherein the molding layer fills the plurality of second holes and a space between the base layer and the redistribution substrate,
wherein a bottom surface of the molding layer is coplanar with bottom surfaces of the plurality of second patterns, and
wherein, when viewed in a plan view, the plurality of first holes and the plurality of second holes are alternately positioned between the plurality of vias.

14. The semiconductor package of claim 13, wherein the molding layer surrounds the plurality of second patterns between the base layer and the redistribution substrate.

15. The semiconductor package of claim 13, wherein interval thickness between the connection substrate and the redistribution substrate is in a range of 10 μm to 30 μm.

16. The semiconductor package of claim 13, wherein the plurality of second holes are alternately disposed between the plurality of first holes.

17. The semiconductor package of claim 13, wherein an inner surface of each of the plurality of second holes is substantially flat, and
wherein an inner surface of each of the plurality of first holes has a bent surface toward an inside of each of the plurality of first holes.

18. The semiconductor package of claim 13, wherein an inner surface of each of the plurality of first holes has a bent surface toward an inside of each of the plurality of first holes, and
wherein an inner surface of each of the plurality of second holes has a bent surface toward an inside of each of the plurality of second holes.

19. The semiconductor package of claim 13, wherein a top surface of the redistribution substrate is substantially flat.

* * * * *